United States Patent
Glick et al.

(10) Patent No.: US 6,207,068 B1
(45) Date of Patent: Mar. 27, 2001

(54) SILICON NITRIDE ETCH BATH SYSTEM

(75) Inventors: Jeffrey S. Glick, Cupertino, CA (US); Erwin E. Grund, Ottendorf-Okbilla (DE)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/195,092

(22) Filed: Nov. 18, 1998

(51) Int. Cl.[7] ................. B05C 3/00; B05D 1/00

(52) U.S. Cl. ............................. 216/93; 156/345

(58) Field of Search ................. 216/93; 156/345

(56) References Cited

U.S. PATENT DOCUMENTS 5,843,850 * 12/1998 Shin et al. .................. 216/93

* cited by examiner

*Primary Examiner*—Thi Dang
(74) *Attorney, Agent, or Firm*—Davis Chin

(57) ABSTRACT

An improved silicon nitride etch bath system is provided. The improved etch bath system includes a silicon dioxide condensing system formed of a heat exchanger and a secondary filter. The heat exchanger is provided for removing a small portion of phosphoric acid from an etching bath and for cooling of the same. The secondary filter is used for extracting silicon dioxide particles in the small portion of the phosphoric acid and is operatively connected to the heat exchanger before returning the same to the etching bath. In this manner, the concentration of silicon dioxide in the etching bath will be prevented from being saturated.

7 Claims, 1 Drawing Sheet

SILICON NITRIDE ETCH BATH SYSTEM

BACKGROUND OF THE INVENTION

This invention relates generally to processing equipment used in the manufacturing of high density semi-conductor wafers. More particularly, it relates to an improved apparatus and a method for extracting of silicon dioxide from an etching bath utilizing silicon-nitride-etching.

As is generally known in the art of manufacturing of high density semiconductor wafers, various layers of silicon materials are typically formed on a substrate. Thereafter, it is also known that a silicon-nitride-etching with hot phosphoric acid process is used so as to remove unwanted silicon nitride from the surfaces of the semiconductor wafers. The phosphoric acid is used to strip the silicon nitride from the semiconductor wafers during the various processing steps.

The preferred chemical process for forming silicon dioxide and ammonia is obtained by reacting silicon nitride with water in the presence of phosphoric acid and is given by the following reaction:

$$Si_3N_4 + 6H_2O \rightarrow 3SiO_2 + 4NH_3H_3PO_4$$

The phosphoric acid is utilized to function as a catalyst rather than serving as an etchant. A prior art silicon nitride etch bath system 10 is shown in FIG. 1 and is labeled as "Prior Art." The silicon nitride etch bath system 10 includes an etching bath 12, a pump 14, a filter 16, and a heater 18 all connected together in series to form a recirculation loop. The etching bath 12 contains a solution of phosphoric acid ($H_3PO_4$) in which the semiconductor wafers (not shown) with silicon-nitride films are inserted for removing of the silicon-nitride. The phosphoric acid flowing into the outer weir 13 adjacent the sides of the bath 12 is sent to the pump 14. The pump is used to recirculate the phosphoric acid via the filter 16 and the heater 18 back to the bath. The temperature of the bath 12 is controlled by the heater 18 and by adding water thereto.

The problem arises as more and more semiconductor wafers are etched in the same solution of phosphoric acid so that the silicon dioxide ($SiO_2$) reaction byproduct becomes more concentrated. The solubility limits for silicon (Si) in the form of silicon dioxide in the phosphoric acid ($H_3PO_4$) at the temperature of 150° C. are about 100 parts-per-million (ppm). Above this limitation, the silicon dioxide will come out of the solution as a solid precipitate or a source of particles. The solid precipitation of silicon dioxide will form as suspensions in solution which may clog the filter 16 and cause contamination on the wafers. As a result, the processing equipment may become inoperable and will be required to be serviced which increases the manufacturing costs as well as involving time-consuming operations. In addition, the chemical in the etching bath must be changed or replaced quite frequently when the solution therein becomes saturated, thereby also increasing production expense.

Further, the amount of silicon dioxide in the solution also modulates the etch-rate of silicon dioxide on the wafers. In practice, it is typically desirable to "season" the etching bath 12 of the phosphoric acid in order to slow down the etch rate of silicon dioxide, but not enough so as to saturate the solution and thus cause the precipitation of particles. Consequently, the etchrate will be varying which produces inconsistent etch results.

In a technical paper authored by K. Sato et al. of the Tohoku University, and entitled "Mechanistic Study of Silicon-Nitride Etching with Hot Phosphoric Acid," there is reported the results of an investigation conducted on silicon-nitride etching and the effects of reaction products to etching rate. It was determined that reaction products precipitated as particles when the concentration was more than 110 ppm of silicon at the temperature of 160°0 C. In FIG. 6 of this paper, there is shown a graph of the solubility of the reaction product as a function of temperature. In particular, it can be seen from the graph that the concentration of silicon in the filtered phosphoric acid was reduced to approximately 20 ppm at the temperature of 50° C.

The inventors of the present invention have utilized this general principle as taught by this aforementioned technical paper that the solubility of silicon in phosphoric acid is significantly decreased when it is cooled in order to realize the instant silicon nitride etch bath system. The silicon nitride etch bath system of the present invention represents a significant improvement over the prior art system of FIG. 1.

SUMMARY OF THE INVENTION

Accordingly, it is a general object of the present invention to provide an improved silicon nitride etch bath system for extracting of silicon dioxide from an etching bath, which is relatively simple and economical to manufacture and assemble, but yet overcomes the disadvantages of the prior art system.

It is an object of the present invention to provide an improved silicon nitride etch bath system for extracting of silicon dioxide from an etching bath which is substantially self-sustaining without requiring frequent change of the chemical in the etching bath.

It is another object of the present invention to provide a silicon nitride etch bath system for extracting of silicon dioxide from an etching bath and a method of the same which eliminates or reduces the need of costly equipment replacement.

It is still another object of the present invention to provide a silicon nitride etch bath system which includes means for removing a small portion of phosphoric acid from an etching bath and cooling of the same so as to prevent the concentration of silicon dioxide from being saturated.

In accordance with these aims and objectives, there is provided in the present invention a silicon nitride etch bath system which includes an etching bath containing phosphoric acid. Semiconductor wafers with silicon-nitride films are disposed in the etching bath. A pump is used for circulating the phosphoric acid from the etching bath to its outlet. A primary filter is operatively connected to the pump outlet for filtering the phosphoric acid. A heater is operatively connected to the primary filter to control temperature of the phosphoric acid before returning the same to the etching bath. A heat exchanger is operatively connected also to the pump outlet for removing a small portion of the phosphoric acid from the etching bath and for cooling of the same. A device for extracting silicon dioxide particles in the small portion of the phosphoric acid is operatively connected to the heat exchanger before returning the same to the etching bath. As a result, the concentration of silicon dioxide in the etching bath will be prevented from being saturated.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENT

Figure 2:
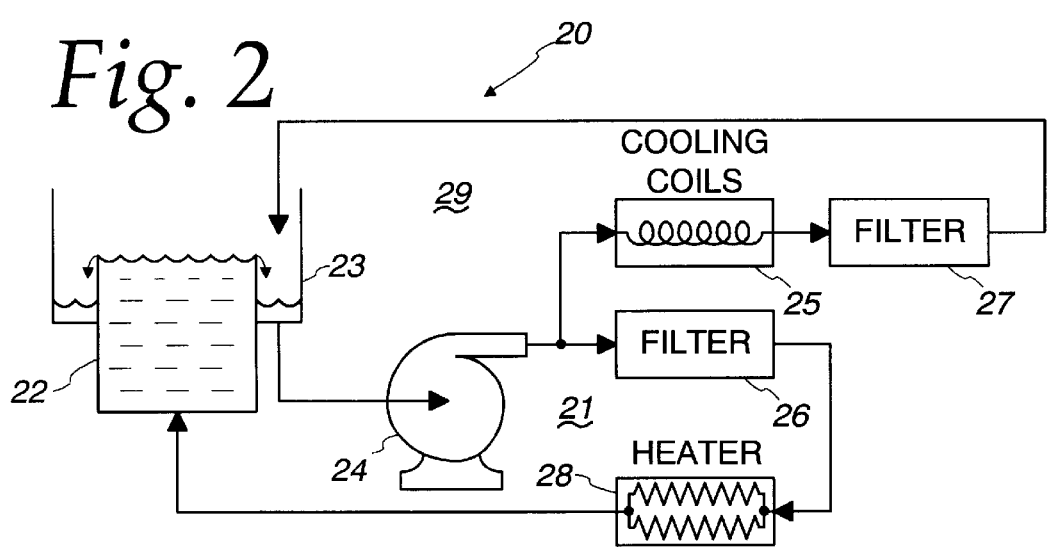
FIG. 2 is a block diagram of an improved silicon nitride etch bath system, constructed in accordance with the principles of the present invention.

Referring now in detail to the drawings, there is shown in FIG. 2 an improved silicon nitride etch bath system 20 for extracting of silicon-dioxide from an etching bath utilizing silicon-nitride-etching, constructed in accordance with the principles of the present invention. The silicon nitride etch bath system 20 is comprised of an etching bath 22, a pump 24, a primary filter 26, and a heater 28 all serially connected together in a main loop 21. The etching bath 22 contains a solution of phosphoric acid ($H_3PO_4$) in which semiconductor wafers (not shown) with silicon-nitride films are inserted for removing of the silicon-nitride.

Figure 1:
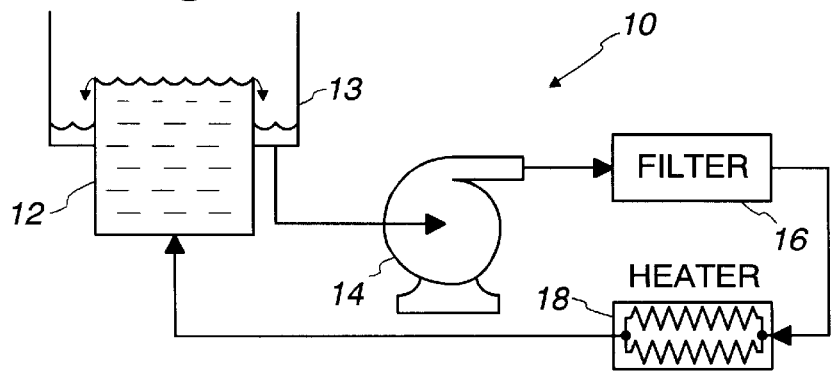
FIG. 1 is a block diagram of a silicon nitride etch bath system of the prior art.

The phosphoric acid flowing in the outer weir 23 adjacent the sides of the bath 22 is sent to the pump 24. The pump is used to recirculate the phosphoric acid via the primary filter 26 and the heater 28 back to the bath. The temperature of the bath is controlled by the heater 28 and by adding water thereto. As thus far described, the components of the silicon nitride etch bath system 20 are identical to the system 10 of FIG. 1. However, in order to avoid the problems caused by the saturation of silicon dioxide in the solution in the etching bath, the silicon nitride etch bath system 20 further includes a silicon dioxide condensing system consisting of a heat exchanger having a cooling coil 25 and a secondary filter 27 connected in series in a secondary loop 29.

A small portion of the solution of phosphoric acid flowing from the pump 24 is removed from the main loop 21. This small portion is fed through the cooling coil 25 in the heat exchanger which serves to lower the temperature of the phosphoric acid so as to decrease the solubility of silicon dioxide therein. Then, the cooled phosphoric acid is delivered to the secondary filter 27 which is used to filter out any solid particles of silicon dioxide. Thereafter, the filtered phosphoric acid is returned to the etching bath 22.

The size of the secondary filter 27 is relatively smaller than the primary filter 26. Further, the secondary filter operates at a lower or cooler temperature than the components in the main loop 21 so that the demands on its materials and structure are less. The secondary filter 27 is easily replaced or re-conditioned on a periodic basis or as when required. In this manner, the concentration of the silicon in the main loop 21 will be prevented from saturation, which eliminates the equipment damage and clogging of the main filter 26.

In operation, the heat exchanger is preferably used to reduce the temperature of the small portion of the phosphoric acid to about 50° C. so that the concentration of silicon in the form of silicon dioxide is approximately 20 ppm. Further, the temperature of the etching bath 22 is maintained at approximately 150° C. so that the maximum concentration of silicon is approximately 100 ppm. As a result, the silicon dioxide in the phosphoric acid flowing in the main loop 21 will not be saturated. Thus, the present silicon nitride etch bath system allows for nearly continuous use of the same chemicals in the etching bath without requiring frequent change thereof.

Figure 3:
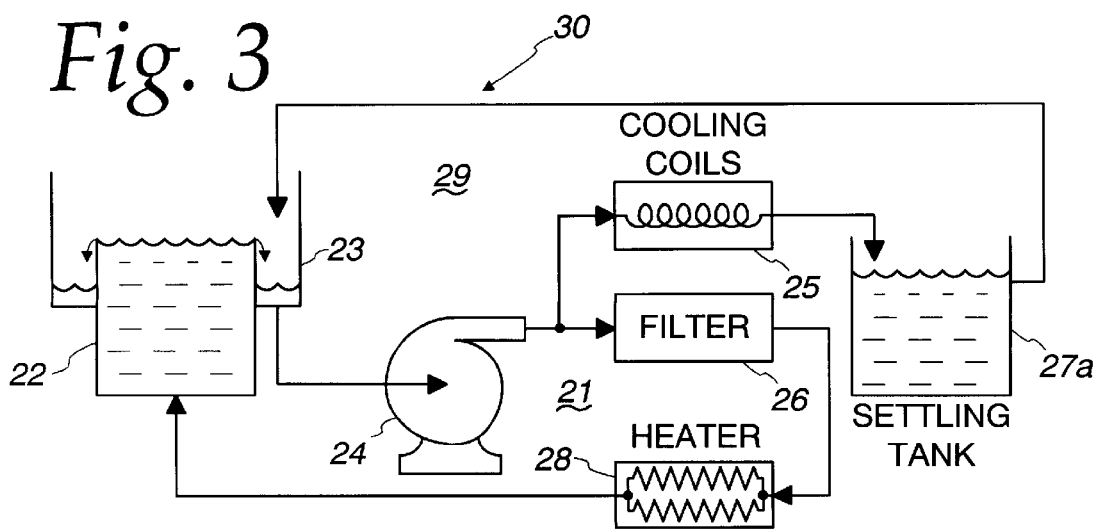
FIG. 3 is a block diagram of an alternative embodiment of an improved silicon nitride etch bath system in accordance with the present invention.

In FIG. 3, there is shown an alternate embodiment of a silicon nitride etch bath system 30 in accordance with the present invention. The system 30 of FIG. 3 is substantially identical to FIG. 2, except the secondary filter 27 is replaced by a settling tank 27a which provides for extra capacity. Other than this difference, the components and operation of the silicon nitride etch bath system 30 of FIG. 3 is the same as FIG. 2. Therefore, no further explanation is believed necessary.

From the foregoing detailed description, it can thus be seen that the present invention provides an improved method and apparatus for extracting of silicon dioxide from an etching bath utilizing silicon-nitride-etching. The silicon nitride etch bath system of the present invention includes a heat exchanger through which a small portion of phosphoric acid from an etching bath is passed and for cooling of the same. A device for removing silicon dioxide particles in the small portion of the phosphoric acid is operatively connected to the heat exchanger before returning it to the etching bath. As a result, the concentration of the silicon dioxide in the etching bath will be prevented from being saturated.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A method for extracting silicon dioxide from a silicon-nitride etching bath comprising the steps of:

providing an etching bath containing phosphoric acid;

depositing semiconductor wafers with silicon-nitride films in said etching bath;

circulating the phosphoric acid from the etching bath;

filtering the phosphoric acid;

controlling temperature of the phosphoric acid before returning the same to the etching bath;

cooling a small portion of the phosphoric acid from the etching bath; and extracting silicon dioxide particles in the small portion of the phosphoric acid before returning the same to the etching bath.

2. A silicon nitride etch bath system comprising in combination:

an etching bath containing phosphoric acid;

semiconductor wafers with silicon-nitride films being deposited in said etching bath;

a pump for circulating said phosphoric acid from said etching bath to its outlet;

a primary filter operatively connected to said pump outlet for filtering said phosphoric acid;

a heater operatively connected to said primary filter to control temperature of said phosphoric acid before returning the same to said etching bath;

heat exchanger means operatively connected also to said pump outlet for removing a small portion of said phosphoric from said etching bath and for cooling of the same; and means operatively connected to said heat exchanger means for extracting silicon dioxide particles in the small portion of said phosphoric acid before returning the same to said etching bath;

whereby the concentration of silicon dioxide in said etching bath will be prevented from being saturated.

3. A silicon nitride etch bath system as claimed in claim 1, wherein said heat exchanger means includes a cooling coil.

4. A silicon nitride etch bath system as claimed in claim 2, wherein said means for extracting silicon dioxide particles is comprised of a secondary filter.

5. A silicon nitride etch bath system as claimed in claim 2, wherein said means for removing silicon dioxide particles is comprised of a settling tank.

6. A silicon nitride etch bath system as claimed in claim 1, wherein the temperature of said etching bath is maintained at approximately 150° C. so that the maximum concentration of silicon is approximately 100 ppm.

7. A silicon nitride etch bath system as claimed in claim 5, wherein said heat exchanger means is used to reduce the temperature of the small portion of phosphoric acid to about 50° C. so that the concentration of silicon dioxide is approximately 20 ppm.

* * * * *

UNITED STATES PATENT AND TRADEMARK OFFICE
CERTIFICATE OF CORRECTION

PATENT NO.    : 6,207,068 B1
DATED         : March 27, 2001
INVENTOR(S)   : J. Glick et al.

It is certified that error appears in the above-identified patent and that said Letters Patent is hereby corrected as shown below:

Column 1,
Below line 21, change
  " $Si_3N_4 + 6H_2O \rightarrow 3SiO_2 + 4NH_3H_3PO_4$ "
to:   -- $\mathbf{Si_3N_4 + 6H_2O \rightarrow 3SiO_2 + 4NH_3}$
          $\mathbf{H_3PO_4}$ --
Line 62, change "etchrate" to -- etch-rate --.

Column 4,
Line 37, change "1" to -- 7 --.
Line 53, change "2" to -- 1 --.

Column 5,
Line 9, change "3" to -- 2 --.
Line 12, change "4" to -- 3 --.

Column 6,
Line 1, change "5" to -- 4 --.
Line 4, change "6" to -- 5 --.
Line 8, change "7" to -- 6 --.

Signed and Sealed this

Twenty-fifth Day of June, 2002

*Attest:*

*Attesting Officer*

JAMES E. ROGAN
*Director of the United States Patent and Trademark Office*